United States Patent
Sasaki (10) Patent No.: US 8,296,693 B2
(45) Date of Patent: Oct. 23, 2012

(54) METHOD AND APPARATUS FOR HARDWARE DESIGN VERIFICATION

(75) Inventor: Lawrence H. Sasaki, North Grenville (CA)

(73) Assignee: ATI Technologies ULC, Markham, Ontario (CA)

( * ) Notice: Subject to any disclaimer, the term of this patent is extended or adjusted under 35 U.S.C. 154(b) by 685 days.

(21) Appl. No.: 12/392,332

(22) Filed: Feb. 25, 2009

(65) Prior Publication Data

US 2010/0218149 A1     Aug. 26, 2010

(51) Int. Cl.
*G06F 17/50* (2006.01)
*G06F 9/44* (2006.01)

(52) U.S. Cl. ........ 716/103; 716/104; 716/106; 716/111; 703/16; 717/126; 717/131

(58) Field of Classification Search .................. 716/103, 716/104, 106, 111; 703/16; 717/126, 131
See application file for complete search history.

(56) References Cited

U.S. PATENT DOCUMENTS

| | | | |
|---|---|---|---|
| 6,141,790 A * | 10/2000 | Beausang et al. | 716/103 |
| 6,449,755 B1 * | 9/2002 | Beausang et al. | 716/106 |
| 6,728,945 B1 * | 4/2004 | Wang | 716/103 |
| 6,996,799 B1 * | 2/2006 | Cismas et al. | 717/106 |
| 7,197,746 B1 * | 3/2007 | Goldberg | 717/140 |
| 7,278,122 B2 * | 10/2007 | Willis | 716/104 |
| 7,496,869 B1 * | 2/2009 | Janneck et al. | 716/103 |
| 7,610,567 B2 * | 10/2009 | Manohar | 716/103 |
| 7,805,690 B2 * | 9/2010 | Willis | 716/103 |
| 2005/0289485 A1 * | 12/2005 | Willis | 716/1 |
| 2007/0256038 A1 * | 11/2007 | Manohar | 716/3 |
| 2008/0250360 A1 * | 10/2008 | Willis | 716/2 |
| 2009/0210841 A1 * | 8/2009 | Prakash et al. | 716/6 |
| 2009/0319962 A1 * | 12/2009 | Manohar | 716/3 |

* cited by examiner

*Primary Examiner* — Phallaka Kik
(74) *Attorney, Agent, or Firm* — Faegre Baker Daniels LLP (57) ABSTRACT

An apparatus for verifying an operation of a hardware descriptor program under test includes a lexical analyzer, a parsing engine and a generator. The lexical analyzer receives input/output (I/O) information of hardware descriptor language code that represents a circuit description of an integrated circuit to be tested. The lexical analyzer performs lexical analysis on the I/O information of the hardware descriptor language code so as to generate a stream of tokens. The parsing engine interprets the stream of tokens representing the I/O information of the hardware descriptor language code based on an interpretation of rules required to test a plurality of functions capable of being executed by the integrated circuit. The generator generates verification module code based on the interpretation of the stream of tokens representing the I/O information of the hardware descriptor language code and the rules interpretation.

17 Claims, 5 Drawing Sheets

METHOD AND APPARATUS FOR HARDWARE DESIGN VERIFICATION

FIELD OF THE INVENTION

The present invention relates generally to hardware design verification, and more particularly, to a method and apparatus for hardware design verification that employs parser engines.

BACKGROUND OF THE INVENTION

With an increase in reliance by system-on-chip (SoC) engineers on re-use in order to minimize design time and reduce risk, the demand for more robust and complicated cores continues to rise. Such robust and complicated cores have to be tested and verified exhaustively to ensure that such cores operate effectively in all possible scenarios, and that a high level of quality is maintained during the test and verification. To this end, there has been an increase in demand for advanced tools and methods for functional verification.

However, the verification of ASIC designs has proven problematic over the years. For example, the overhead required for complete design verification of the infrastructure development and test writing is usually expensive. As such, in the design of many ASICs, the verification activity often lags design activity, and thus, requires verification teams to out-man design teams by a significant ratio.

Another problem encountered in design verification is that a design under test (DUT) description is captured in a number of entities such as tests, models, monitors/checkers, and functional coverage assertions. As a result, a small RTL change requires extensive work on the part of the verification engineers. As an example, a small 10-line RTL change often requires changes to the models to accommodate the new behavior associated with the change. Functional coverage assertions need to change as well so as to capture the new behavior. Also, new test/constraints need to be written to capture the new behavior as well. Thus, the small 10-line RTL change has the potential of exploding into a lot of redundant work in the design verification environment in that creating and maintaining all this code requires a significant amount of effort.

Such techniques tend to focus on merely verifying RTL code/design, and fail to use a more robust approach of double-entry verification that can use two independent implementation descriptions, which can then combine to verify the DUT.

To help reduce the amount of time, effort and code required to verify an ASIC, a number of developments have occurred in the past. One such development utilizes "constrained random" test generation and functional coverage to help reduce the effort required to create tests. Because constrained-random verification can automatically generate a large number of test case within the parameters (i.e., constraints) specified by the verification team, constrained-random verification can hit corner cases that neither the design nor verification engineers would have ever anticipated. Without constrained-random stimulus, design bugs lurking in these corners hide until late in the development cycle, or perhaps, are not found at all until customer usage. However, such constrained-random test generation requires a significant investment of time and effort of the verification engineers to set up the verification infrastructure and run the tests. Moreover, although feedback can be used to adjust constraints to achieve functional coverage, a limited amount of coverage can be achieved using constrained-random techniques. Hence, additional tests and development are usually needed to close the gap not accounted for in the functional coverage.

Other known developmental efforts have suggested algorithmic techniques using a rule-based language based on, for example, BNF (i.e., Backus-Naur Form). BNF is a metalanguage for describing other computer languages. However, these efforts have limited the use of BNF to merely describing computer language syntax that may then be used to automatically generate parsers using compiler-compiler technology. Similar to the previously discussed shortcomings, such current techniques do not reduce the amount of time required to develop the associated infrastructure needed for hardware design verification.

Because many devices under test require extensive verification to ensure that such devices operate at their optimum potential, it is desirable, among other things, to develop a more unified description to synthesize a test environment in order to, for example, level the amount of time and work required for both RTL design and design verification.

BRIEF DESCRIPTION OF THE DRAWINGS

The disclosure will be more readily understood in view of the following description when accompanied by the below figures, wherein like reference numerals represent like elements.

DETAILED DESCRIPTION OF THE PREFERRED EMBODIMENTS

In one example, an apparatus for verifying an operation of a hardware descriptor program under test includes a lexical analyzer, a parsing engine and a generator. If desired, these components/modules can be implemented in separate modules. The lexical analyzer receives input/output (I/O) information of hardware descriptor language code that represents a circuit description of an integrated circuit to be tested. The lexical analyzer performs lexical analysis on the I/O information of the hardware descriptor language code so as to generate a stream of tokens. The parsing engine interprets the stream of tokens representing the I/O information of the hardware descriptor language code based on an interpretation of rules required to test a plurality of functions capable of being executed by the integrated circuit. The generator generates verification module code based on the stream of tokens representing the I/O information of the hardware descriptor language code and the rules interpretation. A related method is also disclosed.

Among other advantages, the apparatus and methods for verifying operations of a hardware descriptor program under test helps to minimize the overhead cost required to achieve complete design verification of related infrastructure development and test writing. In one example, the apparatus for verifying an operation of a hardware descriptor program under test helps reduce the amount of time, effort and code required to verify an ASIC by generating verification module code from a stream of data based on an interpretation of rules information. The verification module code is then used to verify a plurality of functions capable of being executed by the hardware descriptor program under test. Such apparatus and methods use a more robust approach of double-entry verification where two independent implementation descriptions are created, one in RTL and the other based on rules, which can then combine to verify the hardware descriptor program under test.

In one example, the rules correspond to a rule-based language code that enables conditions required to test the plurality of functions. The verification module code corresponds to information code representing monitors, checkers and/or assertions associated with hardware design verification.

In one example, an apparatus for verifying an operation of a hardware descriptor program under test includes an input queue module operative to receive, as tokens, a stream of data from the hardware descriptor program under test. A stack module is operative to store the tokens. A production code module is also operative to verify values associated with each token. The apparatus for verifying the operation of a hardware descriptor program under test also includes a state machine module that is in operative communication with the input queue module to receive rules information related to the hardware descriptor program under test. The state machine module is also operative to monitor the tokens received by the input queue module and authenticate the values associated with the tokens. A generator module is operative to generate verification module code from the stream of data based on an interpretation of the rules information, the verification module code being used to verify a plurality of functions capable of being executed by the hardware descriptor program under test. A related method is also disclosed.

In one example, the stream of data is hardware descriptor language code that represents a circuit description of an integrated circuit to be tested. In another example, the rules information corresponds to a rule-based language code that enables conditions required to test the plurality of functions. Further, the verification module code corresponds to information code representing with monitors, checkers and/or assertions. In yet another example, a state table module can be included to determine operational states of the state machine module.

As used herein, the term "circuit" or "module" can include an electronic circuit, one or more processors (e.g., shared, dedicated, or group of processors such as but not limited to microprocessors, DSPs, or central processing units) and memory, that execute one or more software or firmware programs, combinational logic circuits, an ASIC, and/or other suitable components that provide the described functionality. A "circuit" or "module" can be "powered down" by reducing power to a desired reduced power level including to a level rendering it inoperative. Likewise, a "circuit" or "module" can be "powered up" by increasing its supply power to a level rendering it operative. Additionally, as will be appreciated by those of ordinary skill in the art, the operation, design, and organization, of a "circuit" or "module" can be described in a hardware description language such as Verilog™, VHDL, or other suitable hardware description languages.

Figure 1:
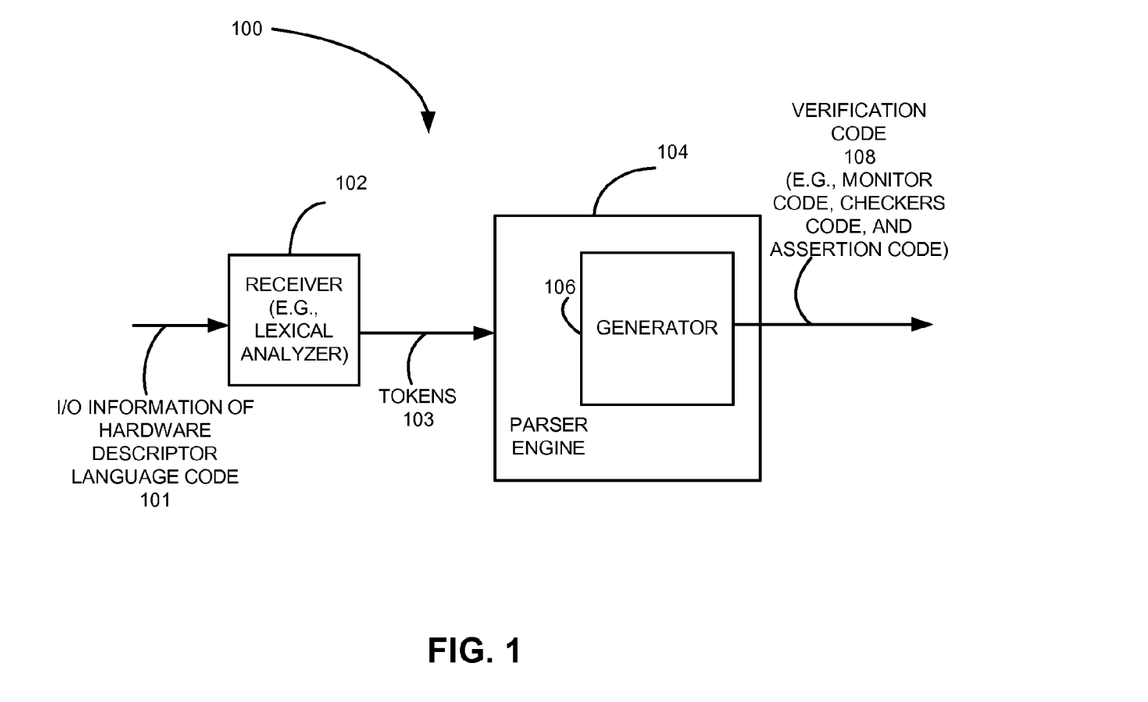
FIG. 1 illustrates an exemplary block diagram of an apparatus for verifying an operation of a hardware descriptor program under test.

FIG. 1 illustrates an exemplary block diagram of an apparatus for verifying an operation of a hardware descriptor program under test. The apparatus 100 includes a lexical analyzer 102, a parsing engine 104 and a generator 106. If desired, these components can be implemented in separate integrated circuits. The lexical analyzer 102 receives I/O information of hardware descriptor language code 101 that represents a circuit description of an integrated circuit to be tested. Such a lexical analyzer 102 is configured with a computer program code that performs lexical analysis on the I/O information of hardware descriptor language code 101 so as to generate a stream of tokens. As used herein, lexical analysis refers to a process of converting a sequence of characters into a sequence of tokens 103. The specification of a programming language will include a set of rules, often expressed syntactically, specifying the set of possible character sequences that can form a token. As used herein, a token refers to a categorized block of text. The block of text corresponding to the token is known as a "lexeme". The lexical analyzer 102 processes lexemes to categorize them according to function, giving them meaning. This assignment of meaning is known as tokenization. Tokens 103 are designed to be a useful part of the structured text. Tokens are frequently defined by regular expressions which are understood by the lexical analyzer 102. Regular expressions provide a means for identifying strings of text of interest, such as particular characters, words, or patterns of characters. Regular expressions can be written in a formal language that can be interpreted by the parser engine 104 that examines text and identifies parts that match the provided specification. To this end, the lexical analyzer 102 reads in a stream of characters, identifies the lexemes in the stream, and categorizes them into tokens 103. This is also refered to as "tokenizing." If the lexical analyzer 102 finds an invalid token, it will report an error.

Following tokenizing, by the lexical analyzer 102, is parsing by the parser engine 104. As used herein, parsing refers to a process of analyzing a sequence of tokens to determine their grammatical structure with respect to a given formal grammar. As such, parser engine 104 can form one of the components in an interpreter or compiler, which checks for correct syntax and builds a data structure (e.g., parse tree, abstract syntax tree or other hierarchical structure) implicit in the input tokens. The parser use the lexical analyzer 102 to create tokens 103 from the sequence of input characters such as the hardware descriptor language code 101. Parsers may be programmed by hand or may be semi-automatically generated in some programming language by a tool (e.g., Yacc) from a grammar written in Backus-Naur form (BNF). BNF is a rule-based language. BNF is also a meta-language for describing other computer languages. (Rule-based languages are described in further detail below).

Thus, the lexical analyzer 102 breaks up the program (i.e., the I/O information of hardware descriptor language code 101 that represents a circuit description of an integrated circuit to be tested) into a stream of tokens 103 which are then parsed by the parsing engine 104. Thereafter, the parsing engine 104 interprets the stream of tokens representing the I/O information of the hardware descriptor language code based on an interpretation of rules required to test a plurality of functions capable of being executed by the integrated circuit. Such rules can be expressed with rules-based language code (e.g., BNF) that enables conditions required to test a plurality of functions. From there, the interpreted data may be loaded into data structures, for general use, interpretation, or compiling.

The generator 106 generates verification module code 108 based on the interpretation of the stream of tokens representing the I/O information of the hardware descriptor language code and the rules interpretation. The generator 106 can be a processor or microcontroller that is configured to generate the verification module code 108. The verification module code corresponds to information code representing monitors, checkers and/or assertions that are components/modules used for hardware design verification. As used herein, monitors refer to a component/module that converts the state of a design and its associated outputs into a transaction abstraction level (i.e., code) so that it can be stored in a database (e.g., score-board database), so that such code can be checked later on. A checker, as used herein, validates that the contents of the database (i.e., score-boards) are valid/legal. The checker can then associate a value that represents the validity of the checked data or content in the database. Assertions, as used herein, refer to formal statements for describing the correct behavior of a design. Thus, the generator 106 can generate verification module code 108 which can include assertions that can be used for assertion-based verification to identify bugs in a design based on assertion failures. When the assertions are generated, based on the verification module code 108, such assertions can then be used to monitor the outputs of a hardware descriptor program code under test. Such assertions serve to indicate when the hardware descriptor program code under test exhibits invalid data when presented with data that violates input rules. Also, such assertions can indicate when the hardware descriptor program code under test exhibits valid data when presented with data that complies with input rules. In both situations, assertions help provide traceback information needed to facilitate debugging during design verification.

Figure 2:
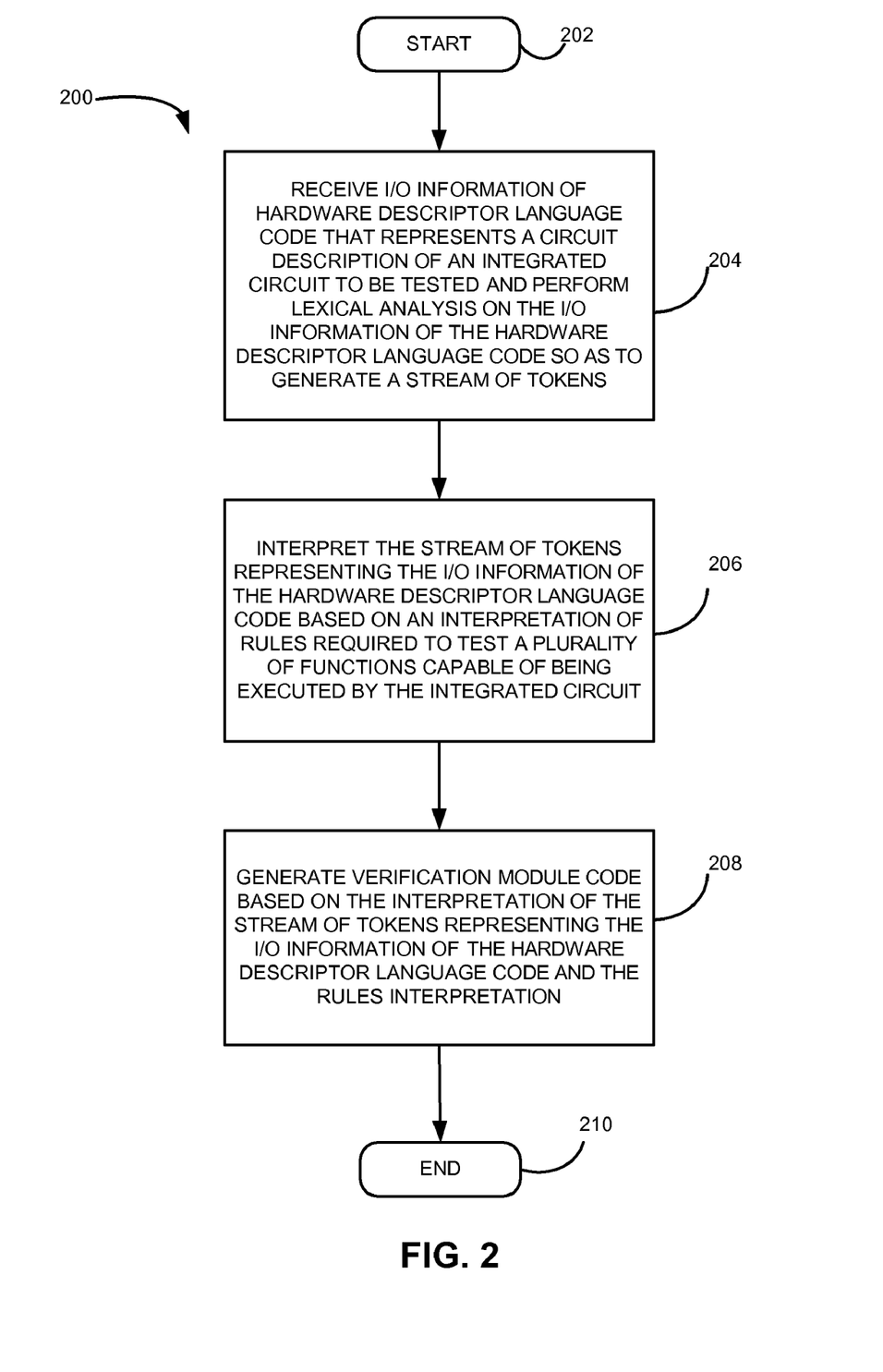
FIG. 2 illustrates in flow-chart form a method for verifying an operation of hardware descriptor program code under test.

FIG. 2 illustrates in flow-chart form a method for verifying an operation of hardware descriptor program code under test as identified at 200. The method starts in operation 202. In operation 204, the lexical analyzer 102 receives I/O information of hardware descriptor language code that represents a circuit description of an integrated circuit to be tested and performs lexical analysis on the I/O information of the hardware descriptor language code so as to generate a stream of tokens. The lexical analyzer 102 is configured with a computer program code that can perform lexical analysis. In operation 206, the parsing engine 104 interprets the stream of tokens representing the I/O information of the hardware descriptor language code based on an interpretation of rules required to test a plurality of functions capable of being executed by the integrated circuit. In operation 208, the verification module code 108 is generated based on the interpretation of the stream of tokens representing the I/O information of the hardware descriptor language code and the rules interpretation. The verification module code can be generated by generator 106, which can be a processor or microcontroller. The verification module code corresponds to information code representative of monitors, checkers and/or assertions as previously described in detail. The process ends in operation 210.

Figure 3:
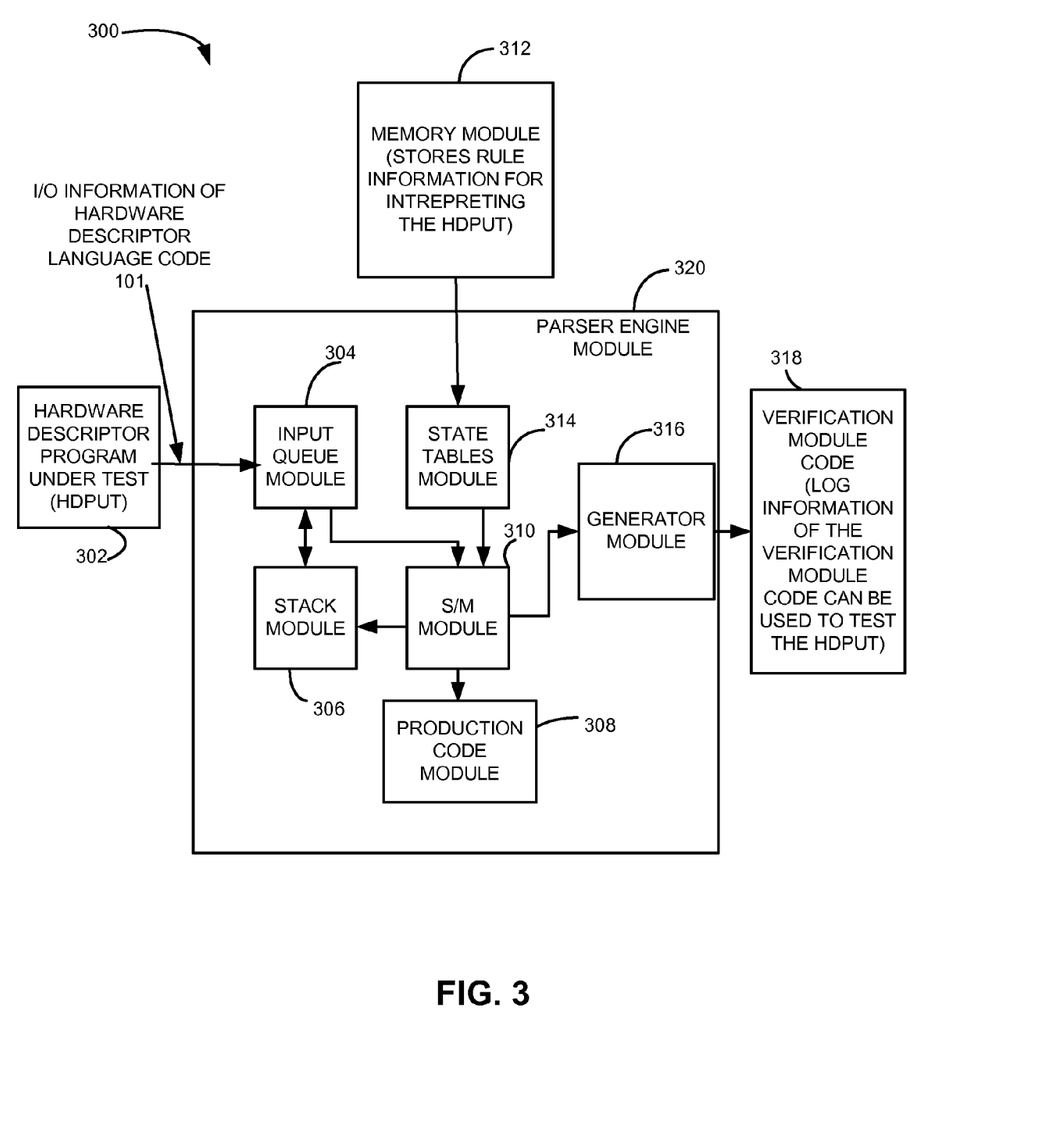
FIG. 3 illustrates an exemplary block diagram of an alternate embodiment of the apparatus 300 for verifying an operation of a hardware descriptor program under test.

FIG. 3 illustrates an exemplary block diagram of an another embodiment of an apparatus 300 for verifying an operation of a hardware descriptor program under test 302. The hardware descriptor program under test 302 can originally be configured as an RTL (i.e., Register Transfer Level) description of hardware/integrated circuit that is to be tested. Such RTL description can be coded by means of a hardware descriptive language (HDL) such as Verilog, as is well known in the art. Input/output information (I/O) of the hardware descriptor language code 101 from the hardware descriptor program under test 302 serves as input to the parser engine module 320. In this example, a parser engine module 320 includes input queue module 304, stack module 306, production code module 308, state machine module 310, state table module 314, and generator module 316. The input queue module 304 is operative to receive, as tokens, a stream of data from the hardware descriptor program under test 302. The input queue module 304 can be configured based on principles similar to a FIFO (First in, First out). Of course, other ways of queuing so as to organize and manipulate data/code relative to time and prioritization can be used, as is well known in the art. The input queue module 304 thus represents a collection of processes from the hardware descriptor program under test 302 that are waiting to be, for example, stored in memory (e.g., stack module 306). The parsing engine module 320 takes tokens from the input queue module 304 and either pushes the tokens onto the stack module 306 or applies a production. The stack module 306 is operative to store the tokens when the tokens are pushed down from the input queue module 304. When a production is applied, the production code module 308 produces the object code representative of the processes being supplied from the hardware descriptor program under test 302. The production code module 308 is also operative to verify values associated with each token. The state machine module 310, which is in operative communication with the input queue module 304, can receive rules information related to the hardware descriptor program under test 304. The state machine module 310 is also operative to monitor the tokens received by the input queue module and authenticate the values associated with the tokens. Memory module 312 stores the rules information that is used for interpreting the hardware descriptor program under test 302. The rules information in memory module 312 can be described by BNF, a rules-based language. Based on the rules information, state transition information required for the transitions of the state machine module can be generated. The state table module 314 represents such state transition information. The state table module 314 can be derived by BNF code, which describes rules required to achieve present state, next state and output of the state machine module 310. The present state specifies the state of the state machine module 310 before the occurrence of a clock pulse. The next state specifies the states of state machine module 310 after the clock pulse, and the output section lists the value of the output variables during the present state. State machine module 310 can also be represented by BNF code describing synchronous logic circuits, since the state machine module 310 operates from state to state in a synchronous fashion and performs specific functions. Of course, a microprocessor module can implement the state machine module 310. Further, a generator module 316 is operative to generate verification module code 318 from the stream of data based on an interpretation of the rules information stored in the memory module 312. Thereafter, the verification module code 318 can be used to verify a plurality of functions that are capable of being executed by the hardware descriptor program under test.

In one example, the rules information corresponds to a rule-based language code that enables conditions required to test the plurality of functions capable of being executed by the hardware descriptor program under test. In another example, the verification module code 318 corresponds to information code representing monitors, checkers and/or assertions.

The rules information corresponds to a rule-based language code that enables conditions required to test the plurality of functions. Generally, a rule is a condition that when satisfied, enables a person to do something or prohibits from doing something. As an example, "if you are hungry, eat some food". Here, "if you are hungry" is a condition that must be satisfied, so that "eat some food" action is taken or executed. Here, there is a logic that depending on whether you are hungry or not hungry, particular action is taken. Similarly, in programming languages such enabling conditions can be utilized in order to take some action, such as executing a statement or function. Such types of languages are called rule-based or logic programming languages. Execution of a rule-based language is similar to an imperative language except that statements are not sequential. Instead, the order of execution of these statements are be dictated by enabling conditions. The general syntax of such languages is:

If (condition 1 is satisfied) then [RULE]→Take action 1
If (condition 2 is satisfied) then [RULE]→Take action 2

An example of a rule-based tool is YACC which is a unix tool for building compiler (parsing) using a rule based technique. To this end, a compiler parses input from a programming language to assembly language or an internal representation by matching the incoming symbols to Backus-Naur form production rules. The parser then applies each production rule to the incoming symbols by working from the left-most symbol yielded on a production rule and then proceeding to the next production rule for each non-terminal symbol encountered.

Figure 4:
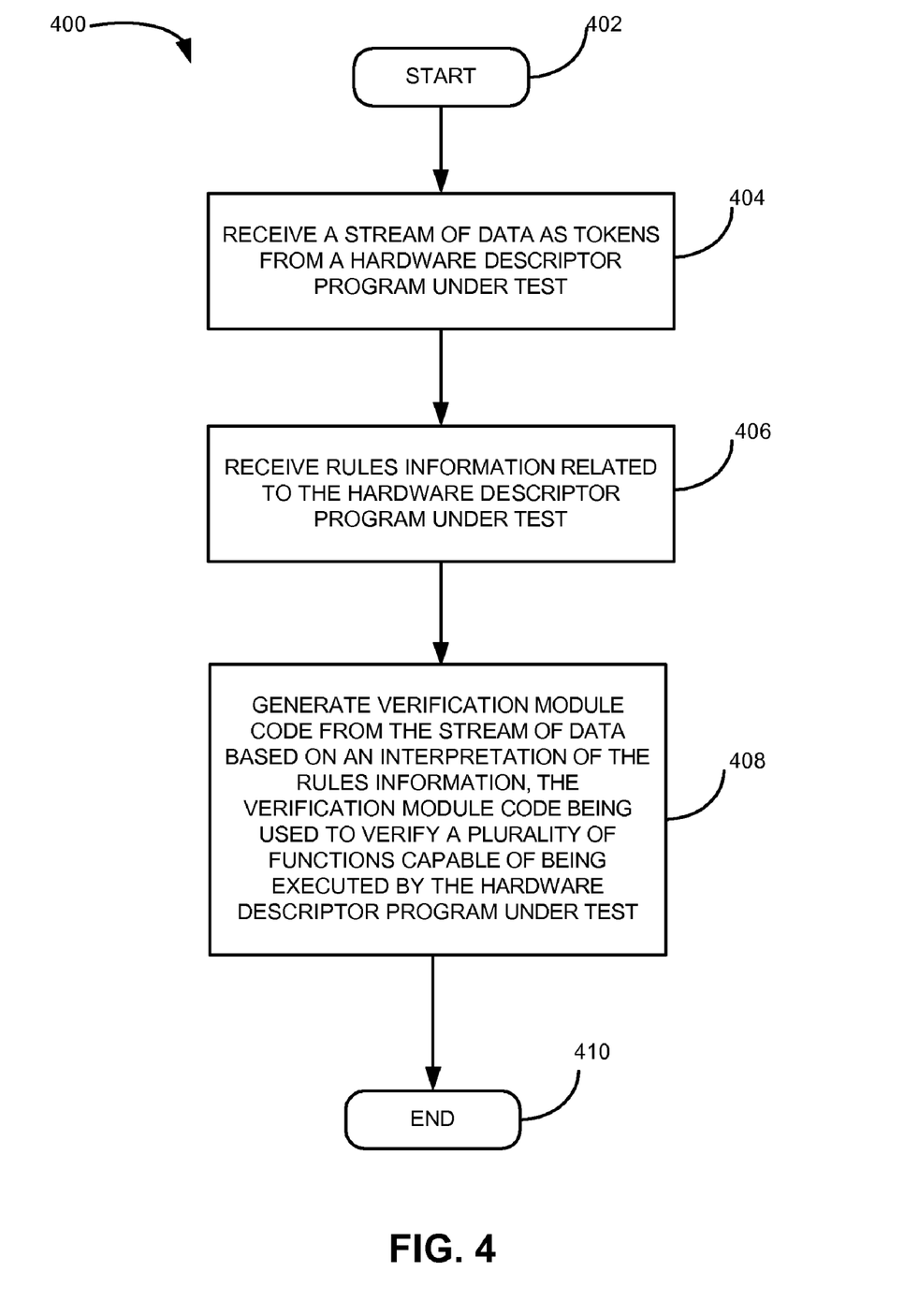
FIG. 4 illustrates in flow-chart form another method for verifying an operation of hardware descriptor program code under test.

FIG. 4 illustrates in flow-chart form another method for verifying an operation of hardware descriptor program code under test as identified at 400. Such verification may be executed by the parser engine module 320. The method starts in operation 402. In operation 404, the input queue 304 can receive, as tokens, a stream of data from the hardware descriptor language program under test 302. In operation 406, rules information related to the hardware descriptor language program under test 302 is received. Verification module code 318 is then generated from the stream of data based on an interpretation of the rules information. The verification module code is then used to verify a plurality of functions that are capable of being executed by the hardware descriptor language program under test 302. Such verification module code 318 corresponds to information code representing with monitors, checkers and/or assertions as previously described in detail. The process ends in operation 410.

In one example, the state machine module 310 is also operative to monitor the tokens received by the input queue module 304, and authenticate the values associated with the tokens.

Figure 5:
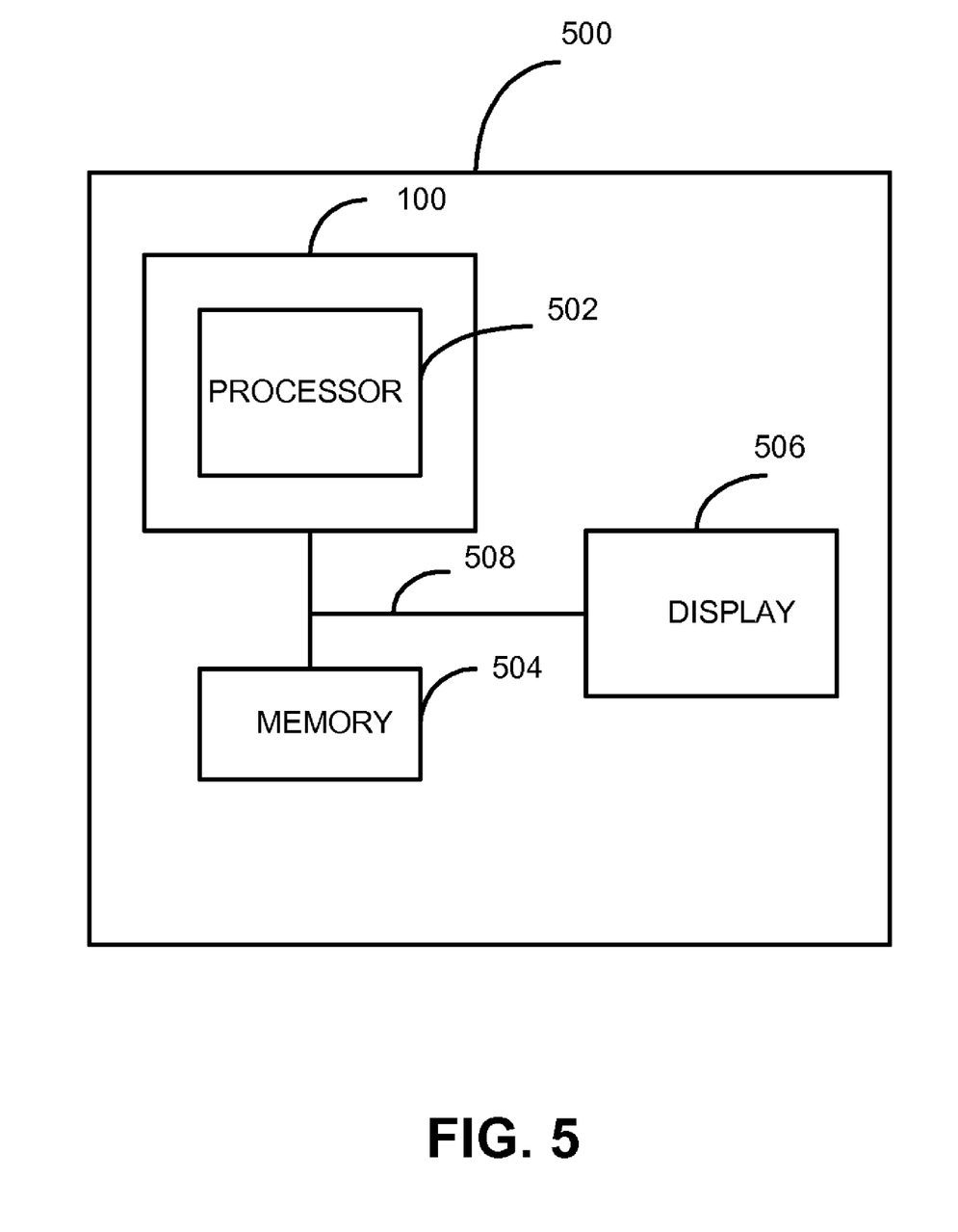
FIG. 5 illustrates a block of an exemplary processing device that may be used to implement the techniques described herein.

Referring now to FIG. 5, the apparatus 100 may be implemented in a device 500 such as a workstation, mobile and/or stationary computer, a LAN interface (wireless and/or wired), a media player, a video decoder and/or encoder, and/or any other suitable device. The device 500 may include, among other things, a processor 502 such as a graphics processor (or core) and/or one or more central processing units (or cores) or any suitable circuitry. The processor 502 may be implemented in the apparatus 100. More specifically, parser engine 104 of the apparatus 100 may include the processor 502.

The device 500 may also include memory 504 such as RAM, ROM, static, discrete logic, dynamic, low latency non-volatile memory such as flash and/or any suitable optical magnetic or electronic data storage that stores executable instructions that may be executed by one or more processors 502. The memory 504 may also include non local memory such as networked memory available via an intranet server, Internet server or any suitable non local memory. Although not depicted, the memory 504 may also be implemented in the apparatus 100.

The device 500 may also include a display 506 and/or any other suitable circuits, interfaces, structures or functional operations. The processor 502, memory 504, and/or display 506 may communicate via a bus 508 and/or any other suitable communication mechanism whether the bus is local, wireless, a network connection or any suitable link.

As noted above, the apparatus 100, among other advantages, helps to minimize the overhead cost required to achieve complete design verification of related infrastructure development and test writing. In one example, the apparatus for verifying an operation of a hardware descriptor program under test helps reduce the amount of time, effort and code required to verify an ASIC by generating verification module code from a stream of data based on an interpretation of rules information. The verification module code is then used to verify a plurality of functions capable of being executed by the hardware descriptor program under test. Such apparatus and methods use a more robust approach of double-entry verification where two independent implementation descriptions are created, one in RTL and the other based on rules, which can then combine to verify the hardware descriptor program under test.

While this disclosure includes particular examples, it is to be understood that the disclosure is not so limited. Numerous modifications, changes, variations, substitutions and equivalents will occur to those skilled in the art without departing from the spirit and scope of the present disclosure upon a study of the drawings, the specification and the following claims.

What is claimed is:

1. An apparatus for verifying an operation of hardware descriptor program code under test, comprising:
   a lexical analyzer to receive input/output (I/O) information of hardware descriptor language code that represents a circuit description of an integrated circuit to be tested and perform lexical analysis on the I/O information of the hardware descriptor language code so as to generate a stream of tokens;
   a parsing engine to interpret the stream of tokens representing the I/O information of the hardware descriptor language code based on an interpretation of rules required to test a plurality of functions capable of being executed by the integrated circuit; and
   a generator to generate verification module code based on the interpretation of the stream of tokens representing the I/O information of the hardware descriptor language code and the rules interpretation.

2. The apparatus of claim 1, wherein the rules correspond to a rule-based language code that enables conditions required to test the plurality of functions capable of being executed by the integrated circuit.

3. The apparatus of claim 1, wherein the verification module code corresponds to information code representing monitors, checkers and/or assertions.

4. A method for verifying an operation of hardware descriptor program code under test carried out by an apparatus, comprising:
   receiving input/output (I/O) information of hardware descriptor language code that represents a circuit description of an integrated circuit to be tested and performing lexical analysis on the I/O information of the hardware descriptor language code so as to generate a stream of tokens;
   interpreting, by the apparatus, the stream of tokens representing the I/O information of the hardware descriptor language code based on an interpretation of rules required to test a plurality of functions capable of being executed by the integrated circuit; and
   generating, using the apparatus, verification module code based on the interpretation of the stream of tokens representing the I/O information of the hardware descriptor language code and the rules interpretation.

5. The method of claim 4, wherein the rules correspond to a rule-based language code that enables conditions required to test the plurality of functions capable of being executed by the integrated circuit.

6. The method of claim 4, wherein the verification module code corresponds to information code representing monitors, checkers and/or assertions.

7. An apparatus for verifying an operation of a hardware descriptor program under test, comprising:
- an input queue module operative to receive, as tokens, a stream of data from the hardware descriptor program under test;
- a stack module operative to store the tokens;
- a production code module operative to verify values associated with each token;
- a state machine module in operative communication with the input queue module to:
  - receive rules information related to the hardware descriptor program under test;
  - monitor the tokens received by the input queue module, and
  - authenticate the values associated with the tokens; and
- a generator module operative to generate verification module code from the stream of data based on an interpretation of the rules information, the verification module code being used to verify a plurality of functions capable of being executed by the hardware descriptor program under test.

8. The apparatus of claim 7, wherein the stream of data is input/output (I/O) information of the hardware descriptor language code that represents a circuit description of an integrated circuit to be tested.

9. The apparatus of claim 7, wherein the rules information corresponds to a rule-based language code that enables conditions required to test the plurality of functions capable of being executed by the hardware descriptor program under test.

10. The apparatus of claim 7, wherein the verification module code corresponds to information code representing monitors, checkers and/or assertions.

11. The apparatus of claim 7, further comprising:
- a state table module for determining operational states of the state machine module.

12. A method for verifying an operation of a hardware descriptor program under test carried out by an apparatus, comprising:
- receiving a stream of data as tokens from the hardware descriptor program under test;
- receiving rules information related to the hardware descriptor program under test; and
- generating, using the apparatus, verification module code from the stream of data based on an interpretation of the rules information, the verification module code being used to verify a plurality of functions capable of being executed by the hardware descriptor program under test.

13. The method of claim 12, further comprising:
- monitoring the tokens; and
- authenticating values associated with each token.

14. An apparatus for verifying an operation of a hardware descriptor program under test, comprising:
- a processor; and
- a computer-readable medium having stored thereon executable instructions that, when executed by the processor, cause the processor to:
  - receive a stream of data as tokens from the hardware descriptor program under test;
  - receive rules information related to the hardware descriptor program under test; and
  - generate verification module code from the stream of data based on an interpretation of the rules information, the verification module code being used to verify a plurality of functions capable of being executed by the hardware descriptor program under test.

15. The apparatus of claim 14, wherein the processor-readable medium further comprises executable instructions that, when executed by the processor, cause the processor to:
- monitor the tokens; and
- authenticate values associated with each token.

16. A non-transitory computer-readable medium having stored thereon executable instructions that, when executed by a processor, cause the processor to:
- receive input/output (I/O) information of hardware descriptor language code that represents a circuit description of an integrated circuit to be tested and perform lexical analysis on the I/O information of the hardware descriptor language code so as to generate a stream of tokens;
- interpret the stream of tokens representing the I/O information of the hardware descriptor language code based on an interpretation of rules required to test a plurality of functions capable of being executed by the integrated circuit; and
- generate verification module code based on the interpretation of the stream of tokens representing the I/O information of the hardware descriptor language code and the rules interpretation.

17. The computer-readable medium of claim 16, wherein the instructions are configured as a hardware description language.

* * * * *